(12) United States Patent
Nishiura et al.

(10) Patent No.: US 6,182,885 B1
(45) Date of Patent: Feb. 6, 2001

(54) WIRE BONDING METHOD

(75) Inventors: Shinichi Nishiura, Fussa; Nobuo Takeuchi, Musashimurayama, both of (JP)

(73) Assignee: Kabushiki Kaisha Shinkawa, Tokyo (JP)

( * ) Notice: Under 35 U.S.C. 154(b), the term of this patent shall be extended for 0 days.

(21) Appl. No.: 09/391,032

(22) Filed: Sep. 7, 1999

(30) Foreign Application Priority Data

Sep. 7, 1998 (JP) .................................................. 10-251701

(51) Int. Cl.⁷ .......................... B23K 31/00; B23K 31/02; B23K 37/00; B23K 1/00; B23K 5/00
(52) U.S. Cl. .................... 228/180.5; 228/4.5; 228/6.2; 228/178
(58) Field of Search .................... 228/180.5, 4.5, 228/6.2, 904, 178

(56) References Cited

U.S. PATENT DOCUMENTS

| | | | |
|---|---|---|---|
| 3,643,321 | * | 2/1972 | Field et al. ........................ 29/470.1 |
| 4,928,871 | * | 5/1990 | Farassat ............................ 228/179 |
| 4,951,120 | * | 8/1990 | Hagiwara et al. .................. 357/70 |
| 5,024,367 | * | 6/1991 | Terakado et al. ................... 228/111 |
| 5,111,989 | * | 5/1992 | Holdgrafer et al. ................ 228/110 |
| 5,437,405 | * | 8/1995 | Asanasavest ....................... 228/180.5 |

FOREIGN PATENT DOCUMENTS

| | | | |
|---|---|---|---|
| 401057725 | * | 3/1989 | (JP) . |
| 1-26531 | | 5/1989 | (JP) . |
| 05283463 | * | 3/1992 | (JP) . |
| 405129357 | * | 5/1993 | (JP) . |
| 5-60657 | | 9/1993 | (JP) . |
| 06310556 | * | 11/1994 | (JP) . |
| 10-125715 | | 5/1998 | (JP) . |

* cited by examiner

Primary Examiner—Patrick Ryan
Assistant Examiner—Zidia T. Pittman
(74) Attorney, Agent, or Firm—Koda & Androlia

(57) ABSTRACT

A method for connecting first and second bonding points with a bonding wire that passes through a capillary comprising the steps of: bonding a ball formed at the end of the wire protruding from the capillary to the first bonding point; raising the capillary; moving the capillary toward the second bonding point so that the capillary is first lowered to a point that is slightly on the first bonding point side of the second bonding point, and a portion of the wire suspended from the capillary is pressed against a horizontal surface located between the first and second bonding points; raising and moving the capillary to a point above the second bonding point, and lowering the capillary so as to bond the wire to the second bonding point.

3 Claims, 6 Drawing Sheets

WIRE BONDING METHOD

BACKGROUND OF THE INVENTION

1. Field of the Invention

The present invention relates to a wire bonding method in which a wire that passes through a capillary is connected to a first bonding point and a second bonding point, and more particularly, to a wire bonding method which forms a low wire loop in low-step-height devices in which the step height between the first and second bonding points is small.

2. Prior Art

Various types of wire bonding methods have been proposed. The most common method is shown in FIGS. 8(*a*) and 8(*b*).

As seen from FIG. 8(*a*), a capillary 2 is lowered with a damper (not shown), which is provided above the capillary 2 so as to hold a wire 1, in an open state; and a ball formed on the tip end of the wire protruding from the tip end of the capillary 2 is bonded to a first bonding point A.

Japanese Patent Application Laid-Open No. H10-125715 discloses a method for forming a ball at the end of a bonding wire. In this prior art, a charging electrode is provided so as to be positioned on one side of a bonding wire, and a magnet is used so that the discharge spark from the electrode is applied to the wire from underneath the wire.

After the ball is bonded to the first bonding point A, the capillary 2 is raised to point B, delivering the wire 1 by an amount that corresponds to the wire length required to form a wire loop. Next, the clamper is closed, and the capillary 2 is moved to point D which is straight above the second bonding point C by performing a circular-arc motion as indicated by a curved arrow.

Then, as shown in FIG. 8(*b*), the capillary 2 is lowered, and the wire 1 is bonded to the second bonding point C. Afterward, the damper is opened, and the capillary 2 and the damper are both raised. During this raising movement, the damper is closed so as to cut the wire 1 from its attachment root at the second bonding point C. The wire bonding of one wire is thus completed.

A wire bonding method of the type described above is disclosed in Japanese Patent Application Publication (Kokoku) No. HI-26531.

The conventional wire bonding method as described has problems when bonding is performed for a low-step-height device in which the step height between the first bonding point A and the second bonding point B is as small as, for instance, 50 microns or less. For instance, as shown in FIG. 8(*a*), when the capillary 2 is moved to a point slightly above the second bonding point C, an excess portion of the wire 1 is suspended from the lower end of the capillary 2, resulting in a wire shape 11 in which a bowed portion 10 is formed. Because of this bowed portion 10, the wire length that is delivered from the capillary 2 is in fact longer than the ideal wire length of the wire shape 12 that is indicated by the two-dot chain line in FIG. 8(*a*). As a result of this excess wire, the wire 1 undergoes a rebound due to plastic deformation when the wire 1 is bonded to the second bonding point C; and a wire loop shape 13 with an upward bow such as that shown in FIG. 8(*b*) is formed.

In a low wire loop in which the apex of the loop is supposed to be the portion 14 above the first bonding point A, the wire loop shape 13 which has such a bow increases the overall height of the wire loop, and it also makes it difficult to control the height of the wire loop in the looping operation. Thus, an unstable wire loop shape is formed. The two-dot chain line shown in FIG. 8(*b*) shows an ideal wire loop shape 19.

SUMMARY OF THE INVENTION

Accordingly, the object of the present invention is to provide a wire bonding method which produces a stable wire loop shape by preventing bowing of the wire loop during bonding to a second bonding point, thus making it possible to form a low wire loop in low-step-height devices.

The above object is accomplished by unique steps in a wire bonding method in which a wire passed through a capillary is connected to a first bonding point and a second bonding point, and in the present invention: a ball formed on the tip end of the wire protruding from the tip end of the capillary is first bonded to the first bonding point; when the capillary is then moved toward the second bonding point the capillary is first lowered to a point that is slightly on the first bonding point side of the second bonding point so as to press the portion of the wire suspended from the tip end of the capillary against a horizontal surface; the capillary is then raised and moved to a point above the second bonding point; and the capillary is lowered; thus bonding the wire to the second bonding point.

DETAILED DESCRIPTION OF THE PREFERRED EMBODIMENTS

Figure 8A:
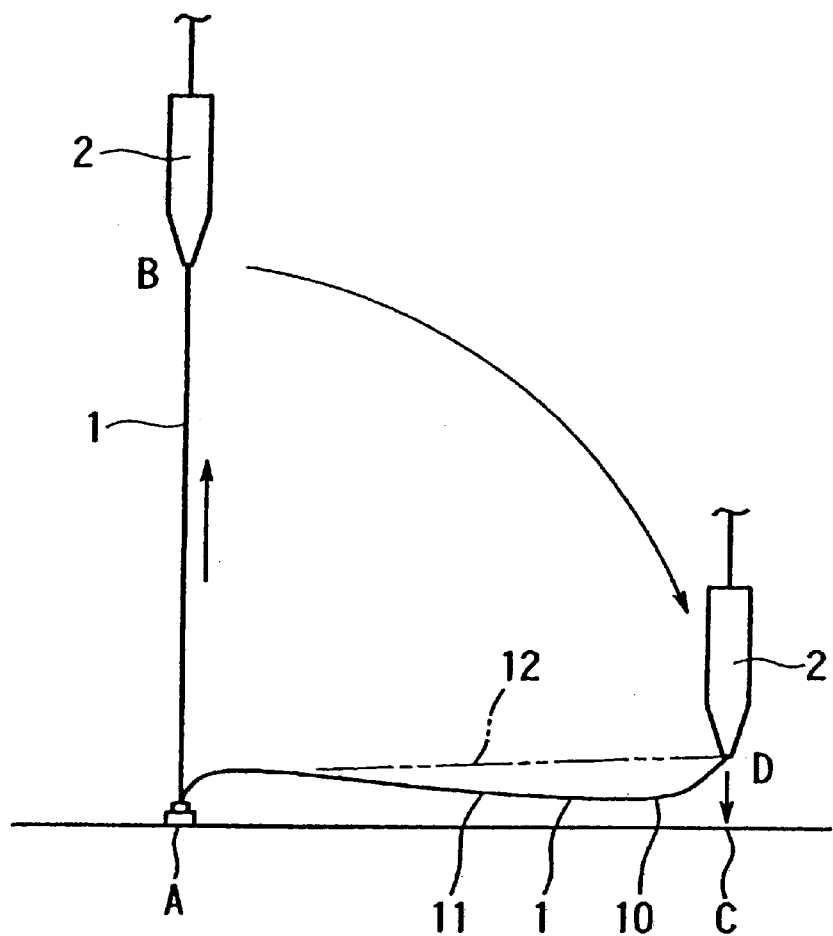
FIGS. 8(*a*) and 8(*b*) are explanatory diagrams of a conventional wire bonding method.

The first embodiment of the present invention will be described with reference to FIGS. 1 through 3. In this description, parts which are the same as in FIGS. 8(*a*) and 8(*b*) or which correspond to those in FIGS. 8(*a*) and 8(*b*) are labeled with the same reference numerals.

Figure 1:
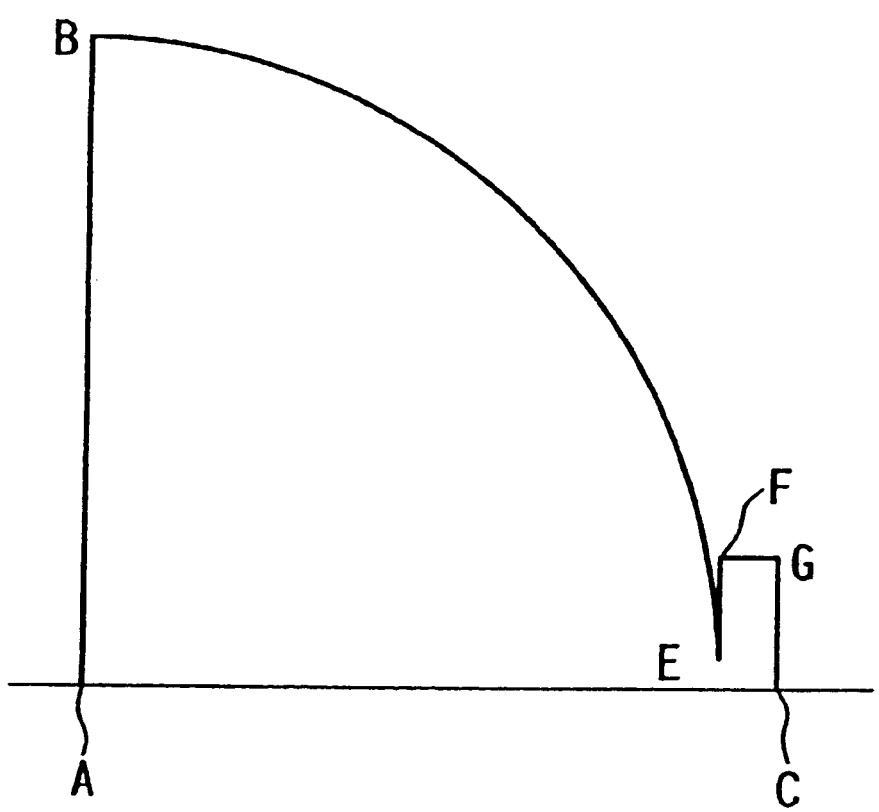
FIG. 1 is a capillary track diagram according to the first embodiment of the wire bonding method of the present invention.
Figure 2:
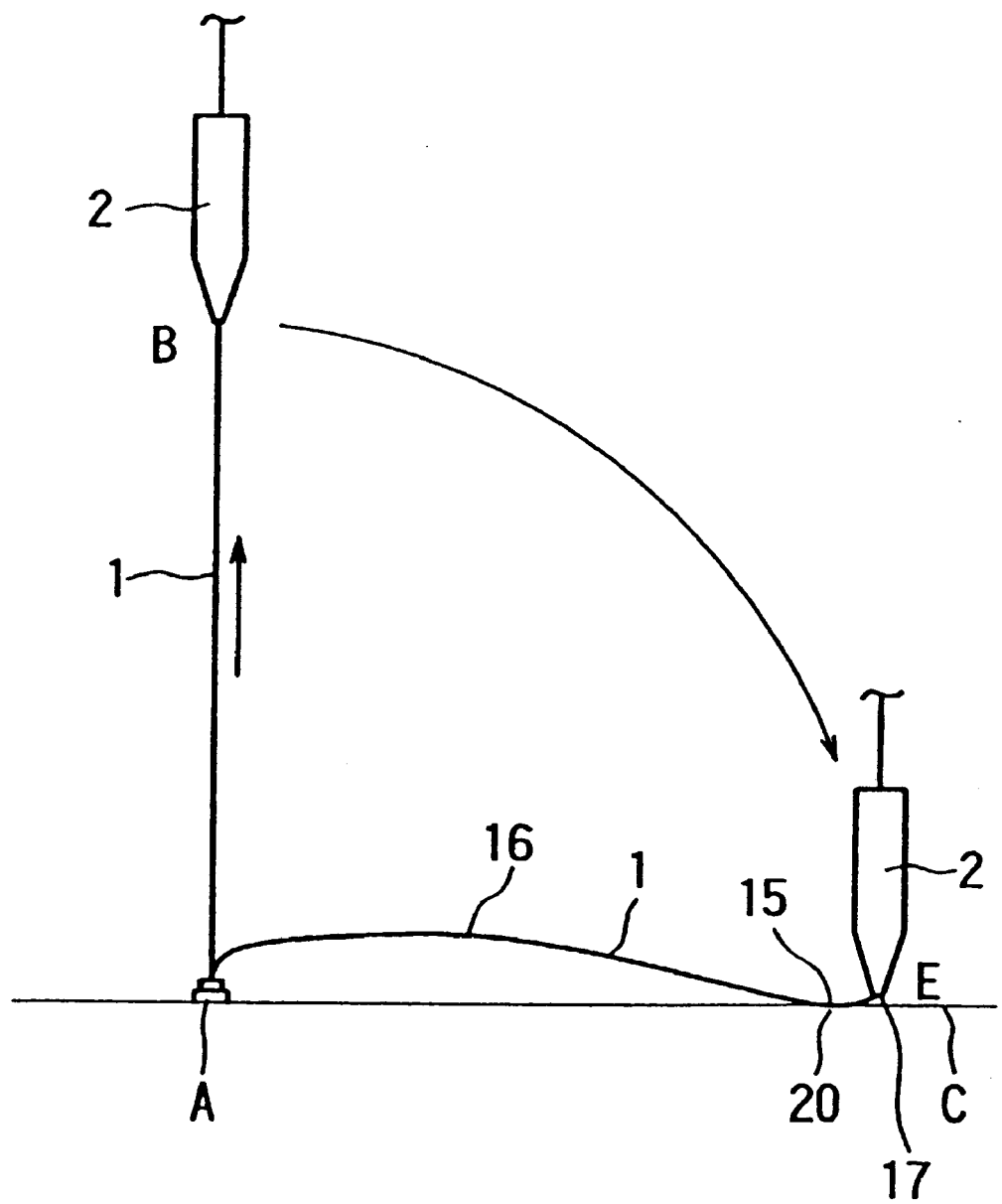
FIG. 2 is an explanatory diagram which illustrates a part of the process of the wire bonding method of the present invention.

As shown in FIGS. 1 and 2, a capillary 2 is lowered with a damper (not shown), which is provided above the capillary 2 so as to hold the wire 1, in an open state; and a ball formed on the tip end of the wire protruding from the tip end of the capillary 2 is bonded to a first bonding point A.

Afterward, the capillary 2 is raised to point B, delivering the wire 1 by an amount that corresponds to a wire length required to form a wire loop between the first bonding point A and a second bonding point C.

Next, the damper is closed, and the capillary 2 is moved, as indicated by a curved arrow in FIG. 2, by a circular-arc motion to point E which is located between the first and second bonding points A and C and slightly toward the first bonding point A from the second bonding point C. Here, point E is a position where a circular portion 15 of the wire that is suspended by the wire's own weight from the tip end of the capillary 2 is pressed against a horizontal surface 20 such as the bonding surface, etc. on which the first and second bonding points A and C are provided. Thus, since the circular portion 15 that is pressed against the horizontal surface 20 is a portion where the suspended wire is pressed against the horizontal surface 20, a rebound due to plastic deformation of the wire 1 is generated as a result of the wire being pressed against the horizontal surface 20. As a result, as shown in FIG. 2, a wire shape 16 in which a bow (or an upward bow) is formed is produced; and the wire portion 17 at the lower end of the capillary 2 is bent upward.

Figure 3A:
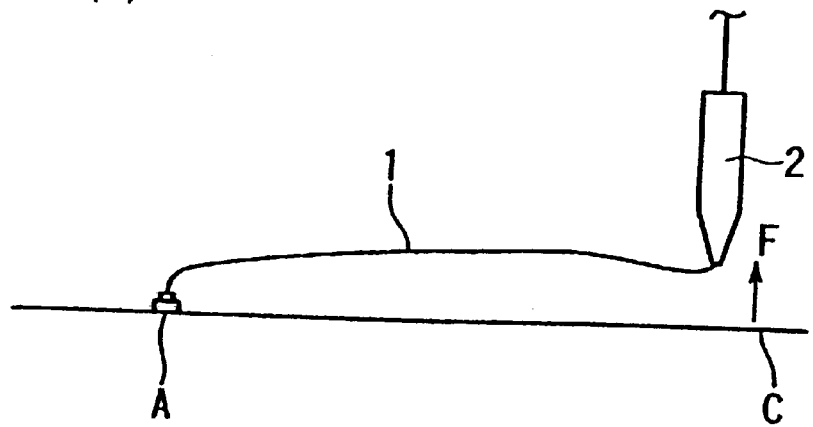
FIGS. 3(*a*), 3(*b*) and 3(*c*) are explanatory diagrams which illustrate steps that follow the process shown in FIG. 2.
Figure 3B:
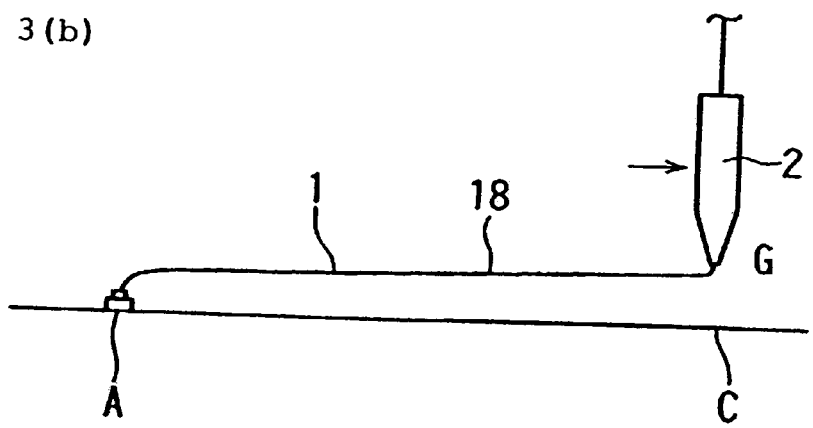

Next, as shown in FIG. 1 and FIG. 3(a), the capillary 2 is raised straight to point F. Then, as shown in FIG. 1 and FIG. 3(b), the capillary is moved (in the direction opposite from the first bonding point A) to point G which is above the second bonding point C. As a result of this movement from point F to point G, the wire 1 is pulled (to the right side in FIGS. 1 and 3(a)) so that the bow in the wire shape 16 shown in FIG. 2 is absorbed; and a wire shape 18 which has an ideal wire length is produced.

Figure 3C:
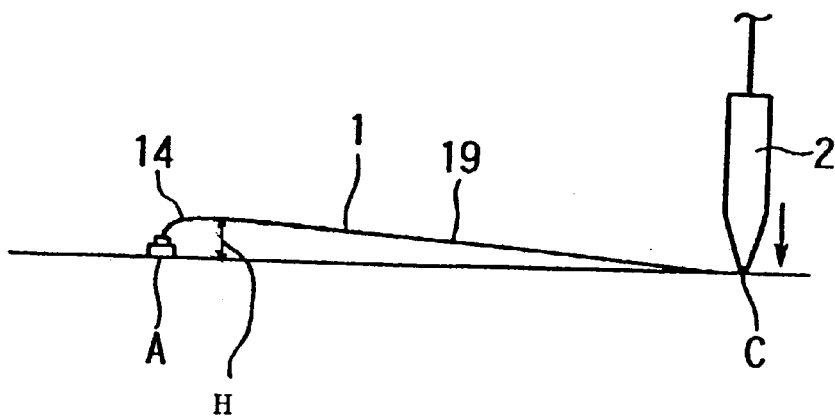

After this, as shown in FIG. 1 and FIG. 3(c), the capillary 2 is lowered, and the wire 1 is bonded to the second bonding point C. Then, as in a conventional method, the damper is opened and the capillary 2 and clamper are both raised. During this raising motion, the damper is closed so as to cut the wire 1 from the attachment root at the second bonding point C. The wire bonding of one wire is thus completed.

As seen from the above, in the present invention, the wire 1 suspended from the lower end of the capillary 2 is pressed against the horizontal surface 20, which is between the first and second bonding points A and C, prior to being bonded to the second bonding point C, after which the capillary 2 is moved to a point above the second bonding point C, and then the wire is bonded to the second bonding point C. Thus, an ideal wire loop shape 19 is obtained as shown in FIG. 3(c). The overall height of this wire loop shape 19 is lower than the wire loop height of the portion 14 located above the first bonding point A; accordingly, this loop can serve as a low wire loop in a low-step-height device.

Figure 8B:
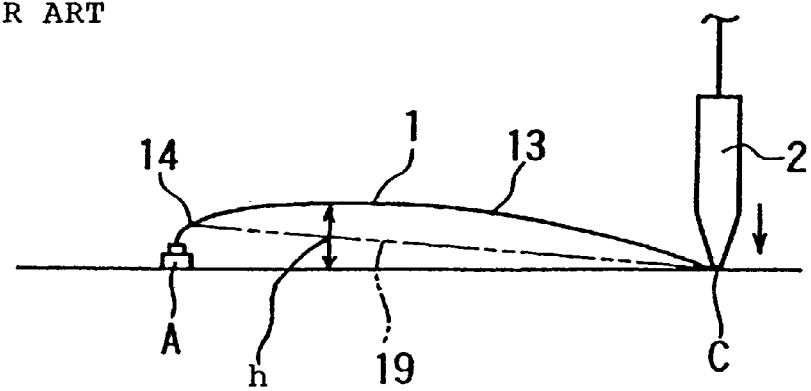

In prior art, the lower limit of the wire loop height (the height h in FIG. 8(b)) has been 150 $\mu$m. However, by the method of the described embodiment, it is possible to set the wire loop height (the height H in FIG. 3(c)) at 50 to 150 $\mu$m. As a result, the range of application to flat-package devices, e.g., optical devices, memory cards, TQFP (thin quad flat packages), etc. is broadened.

Figure 4:
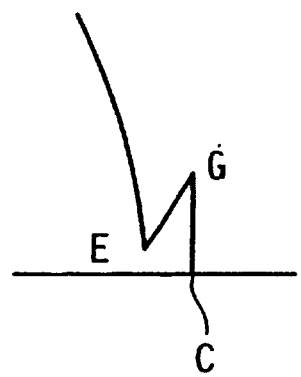
FIG. 4 is a capillary track diagram of the essential part of the wire bonding method according to the second embodiment of the present invention.
Figure 5:
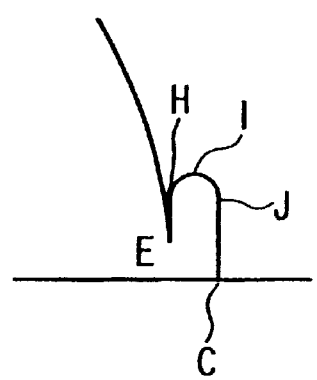
FIG. 5 is a capillary track diagram of the essential part of the wire bonding method according to the third embodiment of the present invention.
Figure 6:
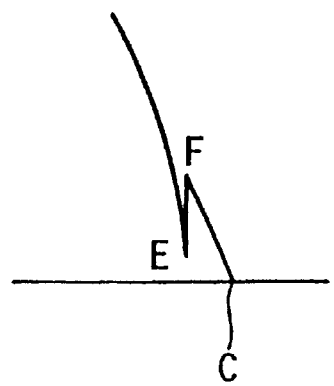
FIG. 6 is a capillary track diagram of the essential part of the wire bonding method according to the fourth embodiment of the present invention.

FIG. 4 illustrates a second embodiment of the present invention, FIG. 5 illustrates a third embodiment of the present invention, and FIG. 6 illustrates a fourth embodiment of the present invention. In these embodiments, the movements of the capillary 2 from point E to point C differ from that of the first embodiment.

In the embodiment of FIG. 4, the capillary 2 is obliquely moved to point G which is above the second bonding point C while being raised from point E so as to pull the wire in a direction opposite to the first bonding point and absorb the bow, and then the capillary 2 is lowered straight down, so that the wire 1 is bonded to the second bonding point C. In the embodiment of FIG. 5, the capillary 2 is raised straight from point E to point H, and then it is moved to point J which is above the second bonding point C by being raised and lowered along a circular arc I so as to pull the wire in a direction opposite to the first bonding point and absorb the bow. Afterward, the capillary 2 is lowered straight, and the wire 1 is bonded to the second bonding point C. In the embodiment of FIG. 6, the capillary 2 is raised straight from point E to point F, after which the capillary 2 is lowered at an inclined angle to the second bonding point C so as to pull the wire in a direction opposite to the first bonding point and absorb the bow, and then the wire 1 is bonded to the second bonding point C.

FIGS. 7(a) through 7(d) show the fifth embodiment of the present invention. In this embodiment, an additional step is taken to the above embodiments.

Figure 7A:
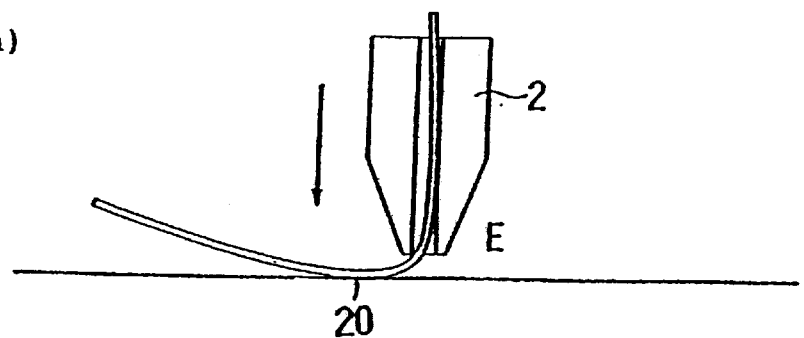
FIGS. 7(*a*) through 7(*d*) show the movement of the capillary in the fifth embodiment of the present invention.
Figure 7B:
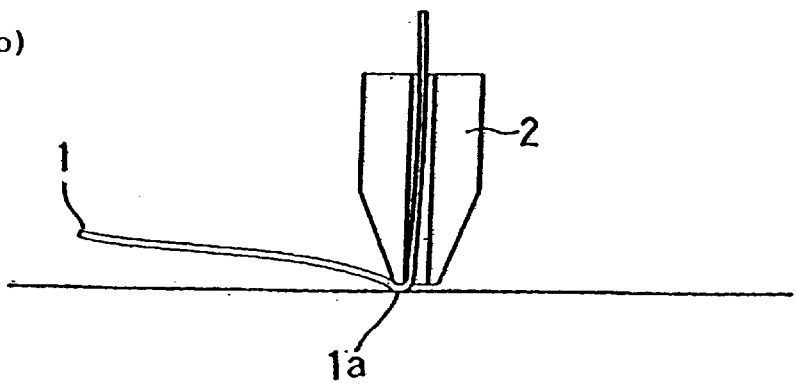
Figure 7C:
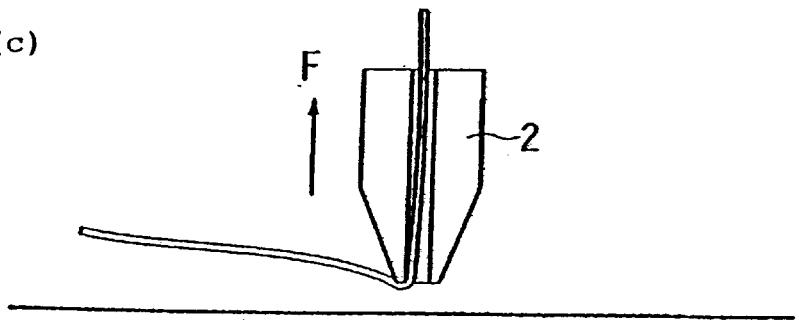
Figure 7D:
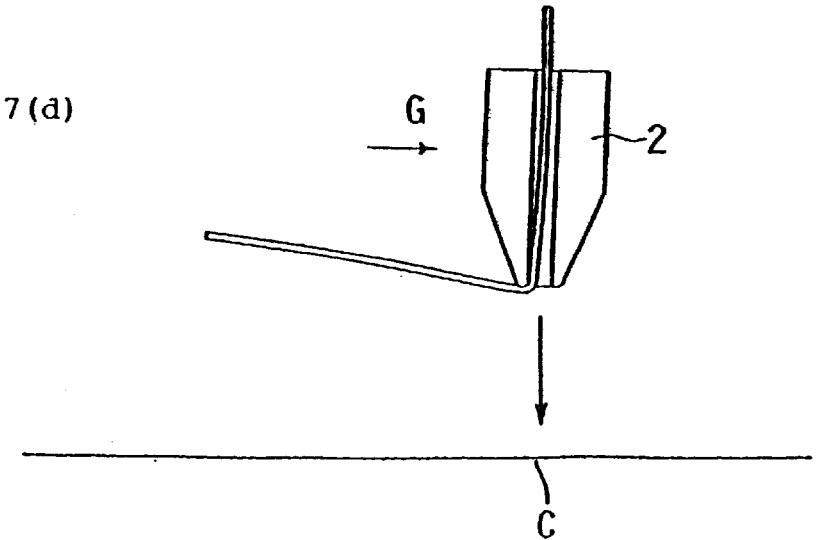

In particular, in this embodiment, as shown in FIG. 7(a) which is equivalent to FIG. 2 of the first embodiment, the capillary 2 is further lowered from point E so as to further press the wire 1 to the horizontal surface 20 as shown in FIG. 7(b), thus forming a sharp bend 1a in the wire 1. After this, as in the first embodiment, the capillary 2 is raised to point F and then moved (in the direction opposite from the first bonding point A) to point G which is above the second bonding point C as shown in FIGS. 7(c) and 7(d). As a result of this movement from point F to point G, the wire 1, that is formed with the upward bow in the wire shape 16 (see FIG. 2) as in the first embodiment, is pulled (to the right side in FIG. 7(d)) by the capillary 2 with the sharp bend 1a is hooked at the lower end of the capillary 2 so that the bow in the wire shape 16 is absorbed as in the first embodiment.

As seen from the above, when the capillary is moved from point E to point C, the bow (an upward bow) of the wire shape 16 shown in FIG. 2 is absorbed, and the wire loop shape 19 shown in FIG. 3(c) is produced. Any movement of the capillary that can absorb the bow in the wire shape 16 may be employed in the present invention, and the present invention is not limited to the described embodiments.

Incidentally, the movement of the capillary 2 from the first bonding point A to point E is not in itself a part of the gist of the present invention, and the capillary can take any moving path between the points A and E. For example, a so-called reverse operation may be performed between the points A and E so that the capillary is raised after the completion of bonding to a first bonding point and then moved in the opposite direction from a second bonding point as disclosed in Japanese Patent Application Publication (Kokoku) No. H5-60657. Furthermore, the horizontal surface is not particularly limited to a smooth surface; and surfaces of any nature can be used, as long as the surface can cause the wire 1 to bow upward when the wire is pressed against such surfaces.

As seen from the above, according to the present invention, when the capillary is moved toward the second bonding point after a ball at the end of a wire protruding from the tip end of the capillary has been bonded to a first bonding point, the capillary is first lowered slightly on the first bonding point side of the second bonding point, and the portion of the wire suspended from the tip end of the capillary is pressed against a surface between the first and second bonding point, the capillary is then raised and moved to a point above the second bonding point, and the capillary is lowered, so that the wire is bonded to the second bonding point. Accordingly, bowing of the wire loop that occurs when bonding to the second bonding point is prevented, so that a stable wire loop shape can be formed, and a low wire loop for use in low-step-height devices can be obtained.

What is claimed is:

1. A wire bonding method in which a wire passing through a capillary is connected between a first bonding point and a second bonding point, wherein;

a ball formed on a tip end of the wire protruding from a tip end of the capillary is first bonded to the first bonding point, the capillary is moved toward the second bonding point, the capillary is first lowered to a point that is slightly on the first bonding point side of the second bonding point, a portion of the wire suspended from the tip end of the capillary is pressed against a horizontal surface to form an upward kink in said wire, the capillary is then raised and moved to a point above the second bonding point, and the capillary is lowered to bond the wire to the second bonding point.

2. A wire bonding method in which first and second bonding points are connected by a wire passing through a capillary, comprising the steps of, bonding a ball formed at a tip end of the wire protruding from the capillary to the first bonding point;

raising the capillary and delivering the wire which will make a wire loop;

moving the capillary arcuately to a location which is between the first and second bonding points and near the second bonding point;

pressing the wire with the capillary against a surface located between the first and second bonding points to form an upward bow in the wire delivered from the capillary;

raising and moving the capillary in a direction opposite to the first bonding point so as to pull the wire and absorb said bow;

moving the capillary to the second bonding point; and bonding the wire to the second bonding point and forming the wire loop between the first and second bonding points.

3. A wire bonding method in which first and second bonding points are connected by a wire passing through a capillary, comprising the steps of:

bonding a ball formed at a tip end of the wire protruding from the capillary to the first bonding point;

moving the capillary away from the first bonding point and delivering the wire which will make a wire loop;

moving the capillary arcuately to a location which is between the first and second bonding points and near the second bonding point;

pressing the wire with the capillary against a surface located between the first and second bonding points to form an upward bow in the wire delivered from the capillary;

moving the capillary further toward said surface located between the first and second bonding points to form a bend in the wire at a lower end of the capillary;

moving the capillary away from said surface located between the first and second bonding points;

moving the capillary in a direction opposite to the first bonding point with said bend hooked by the lower end of the capillary so as to pull the wire at said bend and absorb said bow;

moving the capillary to the second bonding point; and bonding the wire to the second bonding point and forming the wire loop between the first and second bonding points.

* * * * *